(12) United States Patent
Matsumoto et al.

(10) Patent No.: US 10,993,474 B2
(45) Date of Patent: May 4, 2021

(54) METHOD OF MANUFACTURING ATOMIZING UNIT, NON-COMBUSTION TYPE FLAVOR INHALER, ATOMIZING UNIT AND ATOMIZING UNIT PACKAGE

(71) Applicant: JAPAN TOBACCO INC., Tokyo (JP)

(72) Inventors: Hirofumi Matsumoto, Tokyo (JP); Akihiko Suzuki, Tokyo (JP); Takuma Nakano, Tokyo (JP); Manabu Yamada, Tokyo (JP)

(73) Assignee: JAPAN TOBACCO INC., Tokyo (JP)

( * ) Notice: Subject to any disclaimer, the term of this patent is extended or adjusted under 35 U.S.C. 154(b) by 690 days.

(21) Appl. No.: 15/683,256

(22) Filed: Aug. 22, 2017

(65) Prior Publication Data

US 2017/0347717 A1    Dec. 7, 2017

Related U.S. Application Data

(63) Continuation of application No. PCT/JP2015/057062, filed on Mar. 10, 2015.

(51) Int. Cl.
| | |
|---|---|
| *A24F 47/00* | (2020.01) |
| *G01R 27/02* | (2006.01) |
| *H05B 1/02* | (2006.01) |
| *H05B 3/00* | (2006.01) |

(52) U.S. Cl.
CPC ............ *A24F 47/008* (2013.01); *A24F 47/00* (2013.01); *G01R 27/02* (2013.01); *H05B 1/0244* (2013.01); *H05B 3/0014* (2013.01); *H05B 2203/021* (2013.01)

(58) Field of Classification Search
CPC ... A24F 47/008; H05B 3/0014; H05B 1/0244; H05B 2203/021; G01R 27/02
See application file for complete search history.

(56) References Cited

U.S. PATENT DOCUMENTS

| | | |
|---|---|---|
| 2005/0045179 A1 | 3/2005 | Faison, Jr. et al. |
| 2008/0092912 A1 | 4/2008 | Robinson et al. |
| 2012/0174914 A1 | 7/2012 | Pirshafiey et al. |
| 2013/0199528 A1 | 8/2013 | Goodman et al. |
| 2014/0299141 A1* | 10/2014 | Flick .................. H05B 1/0202 131/329 |
| 2014/0334804 A1 | 11/2014 | Choi |
| 2014/0345633 A1 | 11/2014 | Talon et al. |
| 2015/0007553 A1 | 1/2015 | Omiya et al. |

FOREIGN PATENT DOCUMENTS

| | | |
|---|---|---|
| CN | 103889258 A | 6/2014 |
| EP | 0 845 220 A1 | 6/1998 |
| JP | 2002-215246 A | 7/2002 |
| JP | 2009-63966 A | 3/2009 |
| JP | 2010-506594 A | 3/2010 |
| JP | 2014-512207 A | 5/2014 |
| JP | 2014-530632 A | 11/2014 |
| JP | 2015-503916 A | 2/2015 |
| KR | 20-0464889 Y1 | 2/2013 |
| TW | 201322936 A1 | 6/2013 |
| WO | WO 97/48293 A1 | 12/1997 |
| WO | WO 2011/160788 A1 | 12/2011 |
| WO | WO 2013/098396 A2 | 7/2013 |
| WO | WO 2013/145988 A1 | 10/2013 |
| WO | WO 2014/115143 A1 | 7/2014 |

OTHER PUBLICATIONS

Japanese Notification of Reasons for Refusal, dated Nov. 28, 2017, for Japanese Application No. 2017-504492, along with an English translation.
Extended European Search Report for European Application No. 15884571.9, dated Oct. 22, 2018.
Taiwanese Office Action dated Jan. 10, 2017, for Taiwanese Application No. 104143534, with English translation.
Japanese Notification of Reasons for Refusal for corresponding Japanese Application No. 2017-504492, dated Jun. 19, 2018, with machine translation.
Australian Office Action, dated Sep. 13, 2018, for Australian Application No. 2015386187.
Eurasian Office Action, dated Mar. 6, 2019, for Eurasian Application No. 201791994, along with an English translation.
Korean Office Action, dated Aug. 17, 2018, for Korean Application No. 10-2017-7022669, along with an English translation.
International Search Report for PCT/JP2015/057062 (PCT/ISA/210) dated Jun. 16, 2015.
Chinese Office Action and Search Report for Chinese Application No. 201580076972.1, dated May 7, 2019, with English translation of the Office Action.

* cited by examiner

*Primary Examiner* — Michael H. Wilson
*Assistant Examiner* — Dionne W. Mayes
(74) *Attorney, Agent, or Firm* — Birch, Stewart, Kolasch & Birch, LLP

(57) ABSTRACT

A method of manufacturing an atomizing unit comprises: a step A of measuring a resistance value of a resistive heating element which atomizes an aerosol source by resistance heat; and a step B of recording the resistance value measured in the step A, an adjusted power supply output determined in accordance with the resistance value as a power supply output to the resistive heating element or identification information associated with the resistance value or the adjusted power supply output in an information source.

9 Claims, 6 Drawing Sheets

METHOD OF MANUFACTURING ATOMIZING UNIT, NON-COMBUSTION TYPE FLAVOR INHALER, ATOMIZING UNIT AND ATOMIZING UNIT PACKAGE

CROSS REFERENCE TO RELATED APPLICATIONS

This application is a Continuation of PCT International Application No. PCT/JP2015/057062, filed on Mar. 10, 2015, which is hereby expressly incorporated by reference into the present application.

TECHNICAL FIELD

The present invention relates to a method of manufacturing an atomizing unit having a resistive heating element which atomizes an aerosol source without combustion, a non-combustion type flavor inhaler, an atomizing unit, and an atomizing unit package.

BACKGROUND ART

Conventionally, a non-combustion type flavor inhaler configured to inhale a flavor without combustion has been known. The non-combustion type flavor inhaler includes an atomization section which atomizes an aerosol source without combustion, and a flavor source provided to be closer to a mouthpiece side than the atomization section (for example, Patent Literature 1).

The atomization section includes, for example, a wick to suck up the aerosol source and a resistive heating element wound around the wick. In order to suppress variations in the temperature of the resistive heating element wound around the wick, a technique has been proposed in which the temperature of the resistive heating element at the time of supplying electric power to the resistive heating element is measured by thermography, and power supply output to the resistance heating element is adjusted based on the measured temperature (for example, Patent Literature 2).

CITATION LIST

Patent Literature

Patent Literature 1: JP 2010-506594 A
Patent Literature 2: WO 2014/115143 A

SUMMARY

A first feature is summarized as a method of manufacturing an atomizing unit comprising: a step A of measuring a resistance value of a resistive heating element which atomizes an aerosol source by resistance heat; and a step B of recording the resistance value measured in the step A, an adjusted power supply output determined in accordance with the resistance value as a power supply output to the resistive heating element or identification information associated with the resistance value or the adjusted power supply output in an information source.

A second feature is summarized as the method of manufacturing the atomizing unit according to the first feature, wherein the step A is a step of measuring the resistance value after bringing the resistive heating element into contact with an aerosol suction section to suck up the aerosol source and connecting an electrode for connection with a power supply to the resistive heating element.

A third feature is summarized as the method of manufacturing the atomizing unit according to the first feature or the second feature, wherein the step A is a step of measuring the resistance value after assembling the atomizing unit including the resistive heating element.

A fourth feature is summarized as the method of manufacturing the atomizing unit according to any one of the first feature to the third feature, wherein the information source is provided in the atomizing unit including the resistive heating element.

A fifth feature is summarized as the method of manufacturing the atomizing unit according to any one of the first feature to the fourth feature, further comprising a step C of storing the resistance value or the adjusted power supply output in an external storage medium which is accessible to a non-combustion type flavor inhaler including the atomizing unit, wherein the step B is a step of recording the identification information in the information source.

A sixth feature is summarized as the method of manufacturing the atomizing unit according to any one of the first feature to the fifth feature, wherein the step A is a step of measuring the resistance value at temperature lower than use temperature of a non-combustion type flavor inhaler.

A seventh feature is summarized as the method of manufacturing the atomizing unit according to any one of the first feature to the sixth feature, wherein the step A is a step of measuring the resistance value at normal temperature.

A eighth feature is summarized as the method of manufacturing the atomizing unit according to the sixth or the seventh feature, wherein a temperature coefficient α of the resistance value is $0.8 \times 10^{-3} [° \text{C.}^{-1}]$ or less.

A ninth feature is summarized as the method of manufacturing the atomizing unit according to the sixth feature or the seventh feature, wherein a temperature coefficient α of the resistance value is $0.4 \times 10^{-3} [° \text{C.}^{-1}]$ or less.

A tenth feature is summarized as a non-combustion type flavor inhaler comprising: a resistive heating element which atomizes an aerosol source by resistance heat; an information source which includes specifying information configured to specify a power supply output to the resistive heating element; and a control section which controls the power supply output to the resistive heating element based on the specifying information of the information source, wherein the specifying information is a resistance value of the resistive heating element, an adjusted power supply output determined in accordance with the resistance value as the power supply output to the resistive heating element, or identification information associated with the resistance value or the adjusted power supply output.

An eleventh feature is summarized as the non-combustion type flavor inhaler according to the tenth feature, further comprising: an atomizing unit which includes the resistive heating element and the information source; and a control unit which includes the control section.

An twelfth feature is summarized as the non-combustion type flavor inhaler according to the eleventh feature, wherein the control unit includes an external access section to access an external storage medium storing the resistance value or the adjusted power supply output, the information source includes the identification information as the specifying information, and the control section controls the power supply output to the resistive heating element based on information acquired from the external storage medium by the external access section using the identification information.

An thirteenth feature is summarized as the non-combustion type flavor inhaler according to the eleventh feature, wherein the information source stores the resistance value as the specifying information, and the control section controls the power supply output to the resistive heating element by using information read from the information source without considering a change in the resistance value of the resistive heating element accompanying a temperature change.

An fourteenth feature is summarized as the non-combustion type flavor inhaler according to any one of the eleventh feature to the thirteenth feature, wherein a temperature coefficient α of the resistance value of the resistive heating element is $0.8 \times 10^{-3} [° C.^{-1}]$ or less.

An fifteenth feature is summarized as the non-combustion type flavor inhaler according to any one of the eleventh feature to the thirteenth feature, wherein a temperature coefficient α of the resistance value of the resistive heating element is $0.4 \times 10^{-3} [° C.^{-1}]$ or less.

An sixteenth feature is summarized as an atomizing unit comprising: a resistive heating element which atomizes an aerosol source by resistance heat; and an information source which includes specifying information configured to specify a power supply output to the resistive heating element, wherein the specifying information is a resistance value of the resistive heating element, an adjusted power supply output determined in accordance with the resistance value as the power supply output to the resistive heating element, or identification information associated with the resistance value or the adjusted power supply output.

An seventeenth feature is summarized as an atomizing unit package comprising: an atomizing unit which includes a resistive heating element atomizing an aerosol source by resistance heat; and an information source which includes specifying information configured to specify a power supply output to the resistive heating element, wherein the specifying information is a resistance value of the resistive heating element, an adjusted power supply output determined in accordance with the resistance value as the power supply output to the resistive heating element, or identification information associated with the resistance value or the adjusted power supply output.

DESCRIPTION OF EMBODIMENTS

Figure 1:
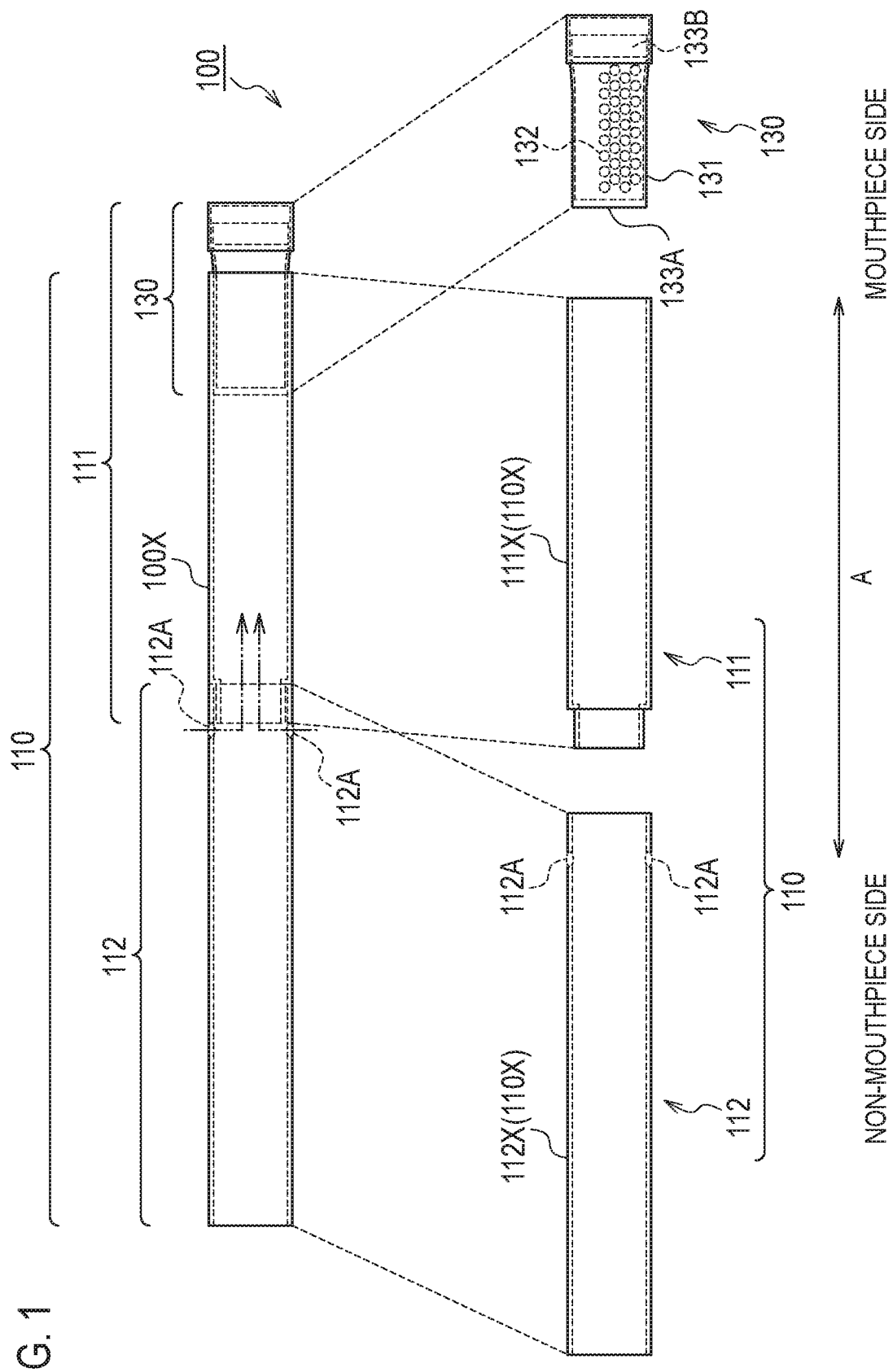
FIG. 1 is a diagram illustrating a non-combustion type flavor inhaler 100 according to a first embodiment.

Next, an embodiment will be described. Note that, the same or similar portions are denoted with the same or similar reference signs in the descriptions of the drawings below. Note that, the drawings are schematic and a ratio of each size is different from a real one.

Therefore, specific sizes and the like should be judged in consideration of the following descriptions. Needless to say, portions of which relationship and ratios of mutual sizes are different between the mutual drawings, are included.

Overview of Embodiments

An object of the above-described Patent Literature 2 is to control the temperature of a resistive heating element so as not to exceed an upper limit temperature allowed for the resistive heating element. Accordingly, it is necessary to use thermography in order to measure the temperature of the resistive heating element at the time of supplying the power to the resistive heating element in Citation Literature 2, but thermography is generally expensive. Further, in order to achieve the above-described object, there is a restriction that it is necessary to perform energization to the resistive heating element for several seconds to cause the wick in the state of sucking up the aerosol source to be brought into contact with the resistive heating element and to raise the temperature of the resistive heating element to the use temperature (temperature of the resistive heating element at the time of using a non-combustion type flavor inhaler).

Firstly, a method of manufacturing an atomizing unit according to the embodiment includes: a step A of measuring a resistance value of a resistive heating element which atomizes an aerosol source by resistance heat; and a step B of recording the resistance value measured in the step A, an adjusted power supply output determined in accordance with the resistance value as a power supply output to the resistive heating element or identification information associated with the resistance value or the adjusted power supply output in an information source.

In the embodiment, the resistance value of the resistive heating element or the adjusted power supply output determined in accordance with the resistance value of the resistive heating element is used as specifying information configured to specify the power supply output to the resistive heating element. That is, thermography is not used, and thus, it is possible to optimize control of the power supply output to the resistive heating element without concerning about the restriction on the use of thermography.

Secondly, a non-combustion type flavor inhaler according to the embodiment includes: a resistive heating element which atomizes an aerosol source by resistance heat; an information source which includes specifying information configured to specify a power supply output to the resistive heating element; and a control section which controls the power supply output to the resistive heating element based on the specifying information of the information source. The specifying information is a resistance value of the resistive heating element, an adjusted power supply output determined in accordance with the resistance value as the power supply output to the resistive heating element, or identification information associated with the resistance value or the adjusted power supply output.

In the embodiment, the resistance value of the resistive heating element, the adjusted power supply output determined in accordance with the resistance value of the resistive heating element, or the identification information associated with the resistance value of the resistive heating element or the adjusted power supply output is used as the specifying information configured to specify the power supply output to the resistive heating element. That is, thermography is not used, and thus, it is possible to optimize control of the power supply output to the resistive heating element without concerning about the restriction on the use of thermography.

First Embodiment (Non-Combustion Type Flavor Inhaler)

Figure 2:
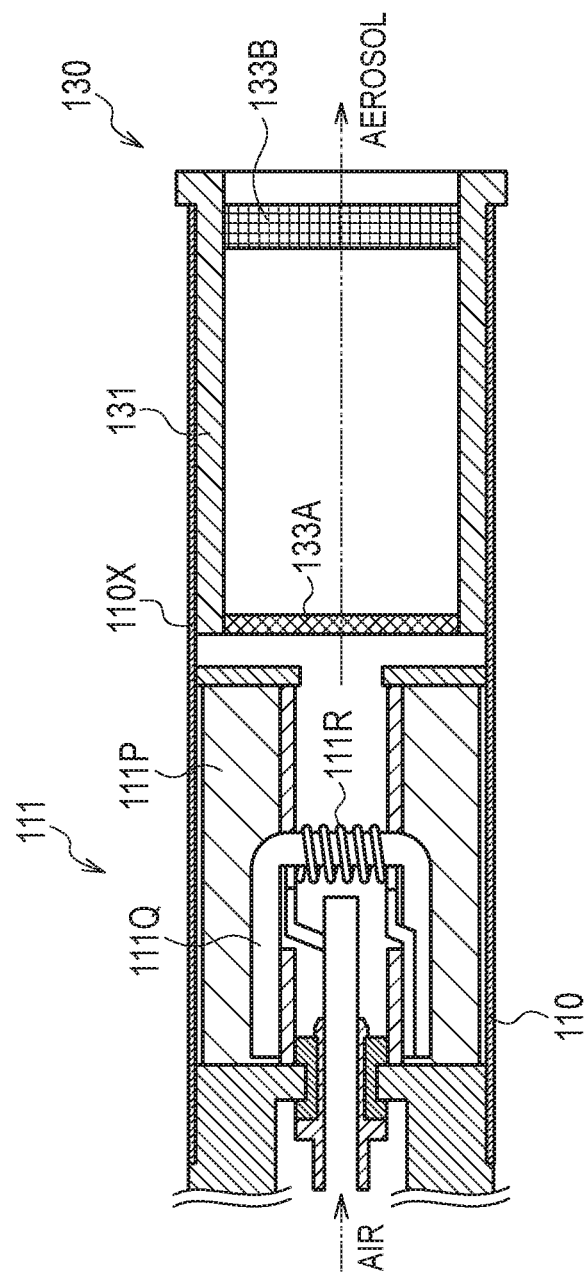
FIG. 2 is a diagram illustrating an atomizing unit 111 according to the first embodiment.

Hereinafter, a non-combustion type flavor inhaler according to a first embodiment will be described. FIG. 1 is a diagram illustrating a non-combustion type flavor inhaler 100 according to the first embodiment. The non-combustion type flavor inhaler 100 is an instrument configured to suck a flavor component without combustion, and has a shape extending in a predetermined direction A which is a direction from a non-mouthpiece end to a mouthpiece end. FIG. 2 is a diagram illustrating an atomizing unit 111 according to the first embodiment. In the following description, it should be noted that the non-combustion type flavor inhaler 100 is simply referred to as a flavor inhaler 100.

As illustrated in FIG. 1, the flavor inhaler 100 includes an inhaler main body 110 and a cartridge 130.

The inhaler main body 110 forms the main body of the flavor inhaler 100, and has a shape connectable to the cartridge 130. Specifically, the inhaler main body 110 has a tubular body 110X, and the cartridge 130 is connected to the mouthpiece end of the tubular body 110X. The inhaler main body 110 includes the atomizing unit 111 which atomizes an aerosol source without combustion and an electrical unit 112.

In the first embodiment, the atomizing unit 111 includes a tubular body 111X that forms a part of the tubular body 110X. As illustrated in FIG. 2, the atomizing unit 111 includes a reservoir 111P, a wick 111Q, and an atomization section 111R. The reservoir 111P, the wick 111Q, and the atomization section 111R are housed in the tubular body 111X. The reservoir 111P holds the aerosol source. For example, the reservoir 111P is a porous body made of a material such as a resin web. The wick 111Q is an example of an aerosol suction section that sucks up the aerosol source held by the reservoir 111P. For example, the wick 111Q is made of glass fibers. The atomization section 111R atomizes the aerosol source sucked up by the wick 111Q. The atomization section 111R is configured using, for example, a resistive heating element (for example, a heating wire) wound around the wick 111Q at a predetermined pitch.

In the first embodiment, the atomization section 111R is an example of the resistive heating element which atomizes the aerosol source by resistance heat. The amount of change in the resistance value of the resistive heating element with respect to temperature of the resistive heating element is expressed by $R(T)=R_0[1+\alpha(T-T_0)]$. Here, $R(T)$ is a resistance value at temperature T, $R_0$ is a resistance value at temperature $T_0$, and $\alpha$ is a temperature coefficient. The temperature coefficient $\alpha$ varies depending on the temperature T, but can be approximated to a constant under production and use conditions of the flavor inhaler 100 according to the first embodiment. In such a case, it is preferable that the temperature coefficient $\alpha$ of the resistance value of the resistive heating element be a value that allows a change of the resistance value between measurement temperature and use temperature to fall within a predetermined range. The measurement temperature is the temperature of the resistive heating element at the time of measuring resistance of the resistive heating element in the manufacture of the flavor inhaler 100. The measurement temperature is preferably lower than the use temperature of the resistive heating element. Further, the measurement temperature is preferably normal temperature (a range of 20° C.±15° C.). The use temperature is the temperature of the resistive heating element at the time of using the non-combustion type flavor inhaler 100 and is in a range of 100° C. to 400° C. When the predetermined range is set to 20% under a condition that the measurement temperature is 20° C. and the use temperature is 250° C., the temperature coefficient $\alpha$ is preferably $0.8 \times 10^{-3}[° C.^{-1}]$ or less, for example. When the predetermined range is set to 10% under the condition that the measurement temperature is 20° C. and the use temperature is 250° C., the temperature coefficient $\alpha$ is $0.4 \times 10^{-3}[° C.^{-1}]$ or less, for example.

The aerosol source is a liquid such as glycerin or propylene glycol. The aerosol source is held, for example, by the porous body made of the material such as the resin web as described above. The porous body may be made of a non-tobacco material or may be made of a tobacco material. Incidentally, the aerosol source may include a flavor source containing a nicotine component or the like. Alternatively, the aerosol source does not necessarily include the flavor source containing the nicotine component or the like. The aerosol source may include a flavor source containing components other than the nicotine component. Alternatively, the aerosol source does not necessarily include the flavor source containing components other than the nicotine component.

The electrical unit 112 has a tubular body 112X that forms a part of the tubular body 110X. The electrical unit 112 includes a power supply to drive the flavor inhaler 100 and a control circuit to control the flavor inhaler 100. The power supply and the control circuit are housed in the tubular body 112X. The power supply is, for example, a lithium-ion battery. The control circuit is configured of, for example, a CPU and a memory. Details of the control circuit will be described later (see FIG. 3).

In the first embodiment, the electrical unit 112 includes a vent hole 112A. As illustrated in FIG. 2, air introduced from the vent hole 112A is guided to the atomizing unit 111 (the atomization section 111R).

The cartridge 130 is configured to be connectable to the inhaler main body 110 forming the flavor inhaler 100. The cartridge 130 is provided to be closer to the mouthpiece side than the atomizing unit 111 on a flow path of a gas (hereinafter, air) sucked from the mouthpiece. In other words, the cartridge 130 is not necessarily provided to be closer to the mouthpiece side than the atomizing unit 111 in terms of a physical space, but may be provided to be closer to the mouthpiece side than the atomizing unit 111 on an aerosol flow path guiding the aerosol generated from the atomizing unit 111 to the mouthpiece side. That is, it may be considered that the "mouthpiece side" has the same meaning as "downstream" of the aerosol flow, and "non-mouthpiece side" has the same meaning as "upstream" of the aerosol flow in the first embodiment.

Specifically, the cartridge 130 includes a cartridge main body 131, a flavor source 132, a mesh 133A, and a filter 133B.

The cartridge main body 131 has a tubular shape extending in the predetermined direction A. The cartridge main body 131 houses the flavor source 132.

The flavor source 132 is provided to be closer to the mouthpiece side than the atomizing unit 111 on the flow path of the air sucked from the mouthpiece. The flavor source 132 gives the flavor component to the aerosol generated from the aerosol source. In other words, the flavor imparted to the aerosol by the flavor source 132 is conveyed to the mouthpiece.

In the first embodiment, the flavor source 132 is configured using a raw material piece that gives the flavor component to the aerosol generated from the atomizing unit 111. The size of the raw material piece is preferably 0.2 mm or more and 1.2 mm or less. Further, the size of the raw material piece is preferably 0.2 mm or more and 0.7 mm or less. As the size of the raw material piece forming the flavor source 132 decreases, its specific surface area increases, and therefore the flavor component is easily released from the raw material pieces forming the flavor source 132. Accordingly, it is possible to suppress the amount of the raw material piece when giving a desired amount of the flavoring component to the aerosol. A shredded tobacco or a molded body obtained by molding a tobacco raw material into a granular shape can be used as the raw material piece forming the flavor source 132. However, the flavor source 132 may be a molded body obtained by molding the tobacco raw material into a sheet shape. Further, the raw material piece forming the flavor source 132 may be made of plants (for example, mint, herbs, or the like) other than the tobacco. A flavor such as menthol may be given to the flavor source 132.

Here, the raw material piece forming the flavor source 132 is obtained by sieving according to JIS Z 8815, for example, using a stainless sieve according to JIS Z 8801. For example, raw material pieces are sieved for 20 minutes by a dry type mechanical shaking method using a stainless sieve having a mesh size of 0.71 mm, thereby obtaining raw material pieces passing through the stainless sieve having the mesh size of 0.71 mm. Subsequently, the raw material pieces are sieved for 20 minutes by the dry type mechanical shaking method using a stainless steel sieve having a mesh size of 0.212 mm, thereby removing raw material pieces passing through the stainless sieve having the mesh size of 0.212 mm. That is, the raw material piece forming the flavor source 132 is the raw material piece which passes through the stainless sieve (mesh size=0.71 mm) defining an upper limit and does not pass through the stainless sieve (mesh size=0.212 mm) defining a lower limit. Accordingly, the lower limit of the size of the raw material piece forming the flavor source 132 is defined by the mesh size of the stainless sieve defining the lower limit in the embodiment. Incidentally, an upper limit of the size of the raw material piece forming the flavor source 132 is defined by the mesh size of the stainless sieve defining the upper limit.

In the first embodiment, the flavor source 132 is a tobacco source having an alkaline pH. The pH of the tobacco source is preferably greater than 7, and more preferably 8 or more. Accordingly, it is possible to efficiently take out the flavor component generated from the tobacco source by the aerosol. Accordingly, it is possible to suppress the amount of the tobacco source when giving the desired amount of the flavoring component to the aerosol. On the other hand, the pH of the tobacco source is preferably 14 or less, and more preferably 10 or less. Accordingly, it is possible to suppress damage (such as corrosion) to the flavor inhaler 100 (for example, the cartridge 130 or the inhaler main body 110).

It should be noted that the flavor component generated from the flavor source 132 is conveyed by the aerosol, and it is unnecessary to heat the flavor source 132 itself.

The mesh 133A is provided so as to close an opening of the cartridge main body 131 on the non-mouthpiece side with respect to the flavor source 132, and the filter 133B is provided so as to close an opening of the cartridge main body 131 on the mouthpiece side with respect to the flavor source 132. The mesh 133A has roughness of a degree that prevents passage of the raw material piece forming the flavor source 132. The roughness of the mesh 133A has a mesh size of, for example, 0.077 mm or more and 0.198 mm or less. The filter 133B is made of a substance having air permeability. The filter 133B is preferably an acetate filter, for example. The filter 133B has roughness of a degree that prevents passage of the raw material piece forming the flavor source 132.

(Block Configuration)

Figure 3:
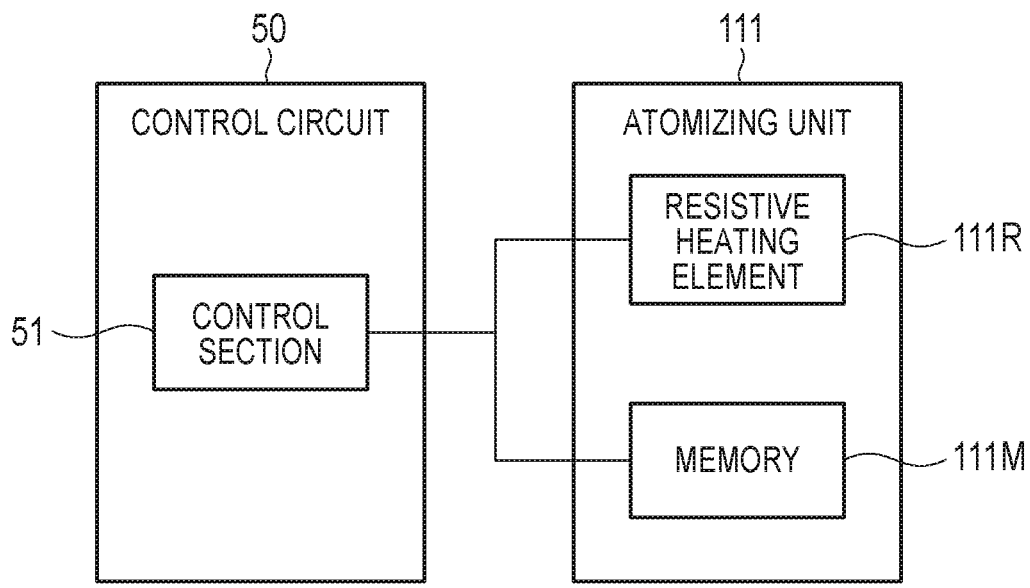
FIG. 3 is a diagram illustrating a block configuration of the non-combustion type flavor inhaler 100 according to the first embodiment.

Hereinafter, a block configuration of the non-combustion type flavor inhaler according to the first embodiment will be described. FIG. 3 is a diagram illustrating the block configuration of the non-combustion type flavor inhaler 100 according to the first embodiment.

As illustrated in FIG. 3, the above-described atomizing unit 111 includes a memory 111M in addition to the atomization section 111R (resistive heating element). The control circuit 50 provided in the electrical unit 112 described above includes a control section 51. The control circuit 50 is an example of a control unit which includes a control section to control a power supply output to the resistive heating element.

The memory 111M is an example of an information source which includes specifying information configured to specify the power supply output to the atomization section 111R (resistive heating element). In the first embodiment, the specifying information is a resistance value of the resistive heating element or an adjusted power supply output determined in accordance with the resistance value of the resistive heating element as the power supply output to the atomization section 111R (resistive heating element).

Here, the resistance value of the resistive heating element may be an actually measured value of the resistance value or an estimated value of the resistance value. Specifically, when the resistance value of the resistive heating element is measured by connecting terminals of a measurement device to both ends of the resistive heating element, it is possible to use the actually measured value as the resistance value of the resistive heating element. Alternatively, it is necessary to consider a resistance value of a part (electrode or the like) other than the resistive heating element when the resistance value of the resistive heating element is measured by connecting a terminal of the measurement device to an electrode connected to the resistive heating element in a state where the electrode for connection with the power supply provided in the flavor inhaler 100 is connected to the resistive heating element. In such a case, it is preferable to use the estimated value in consideration of the resistance value of the part (electrode or the like) other than the resistive heating element as the resistance value of the resistive heating element.

Further, a magnitude of the power supply output to the resistive heating element is defined by a value of a voltage to be applied to the resistive heating element and time for which supply of the power supply output is continued in a case where the voltage is continuously applied to the resistive heating element. On the other hand, the magnitude of the power supply output is defined by the value of the voltage to be applied to the resistive heating element, a duty ratio (that is, a pulse width and a pulse interval), and the time for which the supply of the power supply output is continued in a case (pulse control) where the voltage is intermittently applied to the resistive heating element.

The control section 51 controls the power supply output to the resistive heating element based on the specifying information included in the memory 111M.

Figure 4:
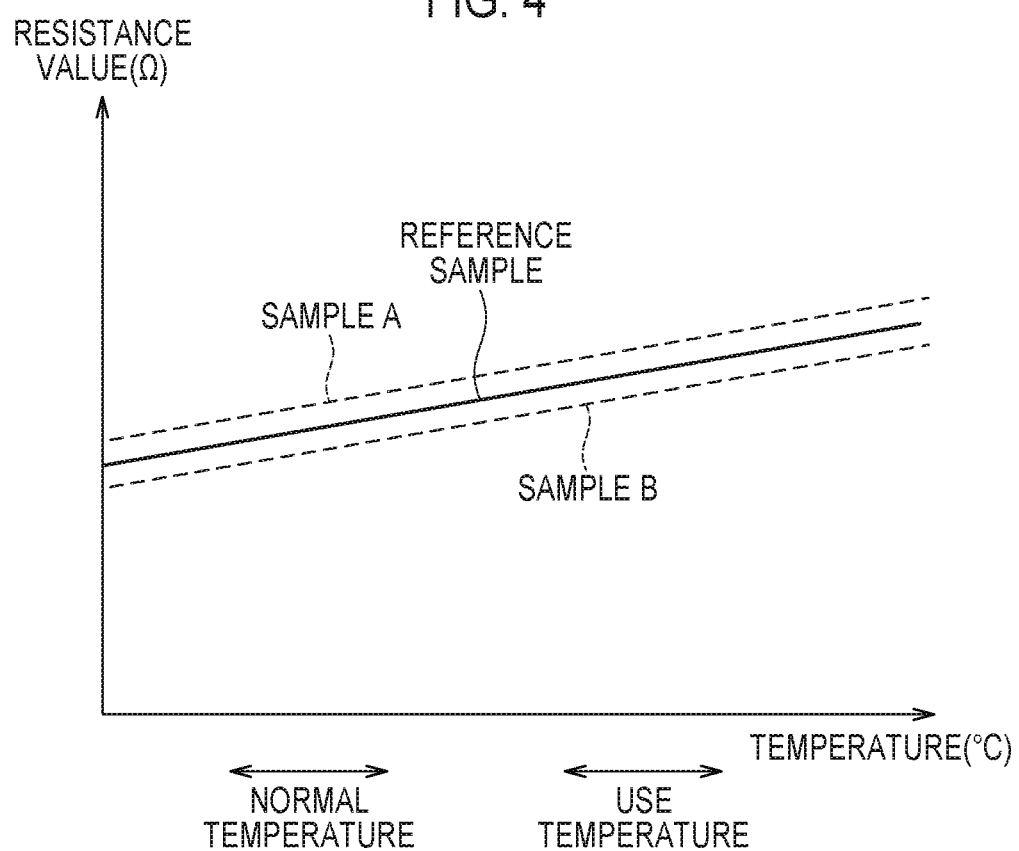
FIG. 4 is a diagram for describing a characteristic of a resistance value of the atomization section 111R (resistive heating element) according to the first embodiment.

For example, a description will be given by exemplifying a case where the resistance value of the resistive heating element has a characteristic illustrated in FIG. 4. In FIG. 4, the vertical axis represents the resistance value (Ω), and the horizontal axis represents the temperature (° C.). The normal temperature is in the range of 20° C.±15° C. The use temperature is the temperature of the resistive heating element at the time of using the non-combustion type flavor inhaler 100 and is in a range of 100° C. to 400° C. The use temperature is appropriately determined depending on composition of the aerosol source. An inclination of the resistance value is the amount of change in the resistance value of the resistive heating element relative to the temperature of the resistive heating element (that is, the temperature coefficient α).

As illustrated in FIG. 4, a resistance value of a sample A (resistive heating element) is higher than a resistance value of a reference sample (resistive heating element) when the temperature is the same. A resistance value of a sample B (resistive heating element) is lower than the resistance value of the reference sample (resistive heating element) when the temperature is the same. It should be noted that the resistance value of the atomization section 111R (resistive heating element) depends on a length of the resistive heating element, a thickness of the resistive heating element, and the like, and thus, has variations for each of the atomization sections 111R (resistive heating elements).

Under such a premise, the control section 51 controls a power supply output to the sample A so as to be higher than a reference output when a power supply output to the reference sample (resistive heating element) is the reference output in order to obtain desired temperature. On the other hand, the control section 51 controls a power supply output to the sample B so as to be lower than the reference output. Accordingly, it is possible to obtain the desired temperature while suppressing the variation in the resistance value for each of the atomization sections 111R (resistive heating elements).

In order to implement such control, the specifying information included in the memory 111M may be the resistance value of the resistive heating element or the adjusted power supply output determined in accordance with the resistance value of the resistive heating element as described above.

More specifically, when the specifying information is the resistance value of the resistive heating element, the control section 51 can appropriately control the power supply output to the resistive heating element based on the resistance value read from the memory 111M if a correspondence relationship between the power supply output to the resistive heating element and the resistance value has been already grasped. Further, when the specifying information is the adjusted power supply output determined in accordance with the resistance value of the resistive heating element, the control section 51 can appropriately control the power supply output to the resistive heating element based on the adjusted power supply output read from the memory 111M.

Here, the control section 51 preferably controls the power supply output to the resistive heating element using the resistance value read from the memory 111M without considering the change in the resistance value of the resistive heating element accompanying the temperature change. Alternatively, the control section 51 preferably controls the power supply output to the resistive heating element using the adjusted power supply output read from the memory 111M without considering the change in the resistance value of the resistive heating element accompanying the temperature change.

Incidentally, the resistance value of the resistive heating element is preferably measured at temperature lower than the use temperature of the resistive heating element, and more preferably measured at normal temperature. Accordingly, it is unnecessary to perform energization to the resistive heating element until the temperature of the resistive heating element reaches the use temperature, and it is possible to simplify the process of manufacturing the atomizing unit 111. In such a case, it is preferable that the temperature coefficient α of the resistance value of the resistive heating element be $0.8 \times 10^{-3}$[° C.$^{-1}$] or less (preferably, $0.4 \times 10^{-3}$[° C.$^{-1}$] or less). Accordingly, a difference of a resistance value with respect to the resistance value of the resistive heating element at the use temperature is small even when a value measured at the temperature (for example, normal temperature) lower than the use temperature of the resistive heating element is used as the resistance value of resistive heating element without considering the change in the resistance value of the resistive heating element accompanying the temperature change. Therefore, it is possible to appropriately suppress the variation in the temperature of the resistive heating element accompanying the variation in the resistance value of the resistive heating element.

(Action and Effect)

In the first embodiment, the resistance value of the resistive heating element or the adjustment power supply determined in accordance with the resistance value of the resistive heating element is used as the specifying information configured to specify the power supply output to the resistive heating element (atomization section 111R). That is, thermography is not used, and thus, it is possible to optimize control of the power supply output to the resistive heating element without concerning about the restriction on the use of thermography.

In the first embodiment, the information source (memory 111M) which includes the specifying information is provided in the atomizing unit 111. Therefore, even in the case where the atomizing unit 111 can be replaced, it is possible to appropriately suppress the variation in the temperature of the resistive heating element accompanying the variation in the resistance value of the resistive heating element by reading the specifying information from the memory 111M provided in the atomizing unit 111.

Modified Example 1

Hereinafter, Modified Example 1 of the first embodiment will be described. Differences from the first embodiment will be described hereinafter.

Specifically, the specifying information included in the memory 111M is the resistance value of the resistive heating element or the adjusted power supply output determined in accordance with the resistance value of the resistive heating element in the first embodiment as described above. In contrast, the specifying information of the memory 111M is identification information associated with the resistance value of the resistive heating element or the adjusted power supply output in Modified Example 1.

(Block Configuration)

Figure 5:
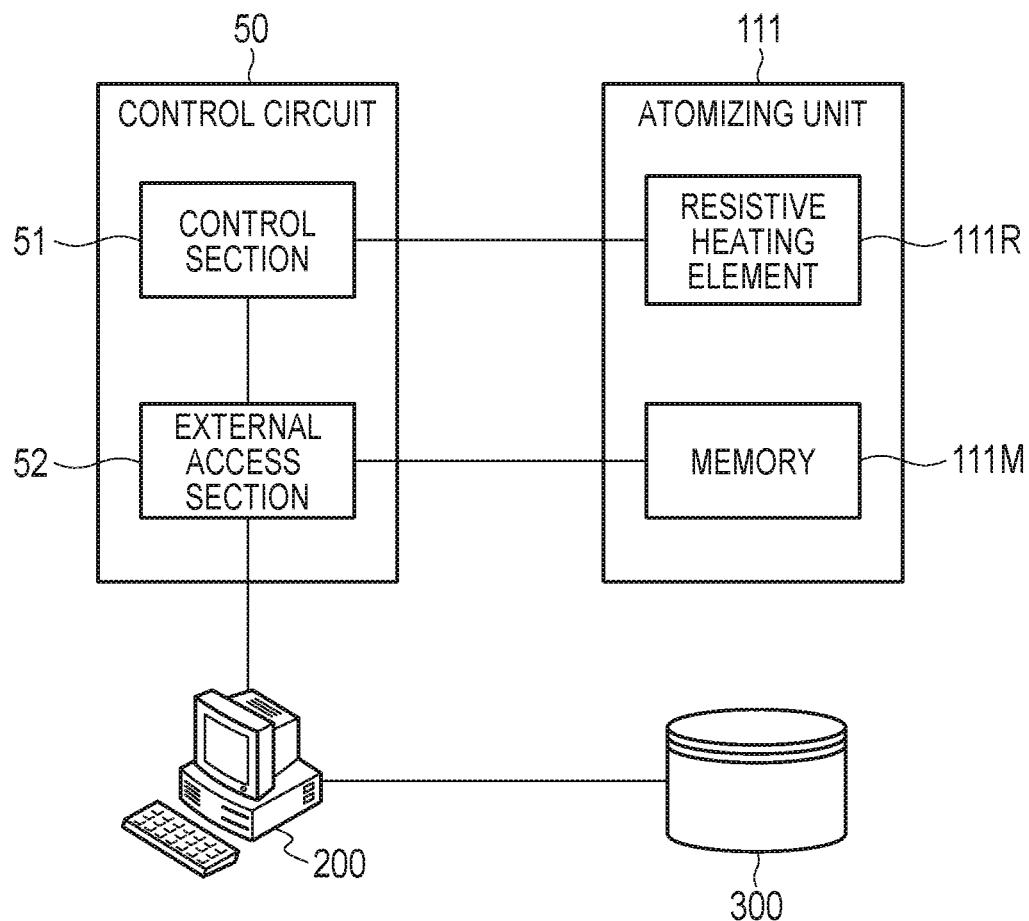
FIG. 5 is a diagram illustrating a block configuration of a non-combustion type flavor inhaler 100 according to Modified Example 1.

Hereinafter, a block configuration of a non-combustion type flavor inhaler according to Modified Example 1 will be described. FIG. 5 is a diagram illustrating the block configuration of the non-combustion type flavor inhaler 100 according to Modified Example 1. It should be noted that the same configurations as those in FIG. 3 are denoted by the same reference signs in FIG. 5.

Here, a communication terminal 200 is a terminal having a function of communicating with a server 300 in FIG. 5. The communication terminal 200 is, for example, a personal computer, a smartphone, a tablet, or the like. The server 300 is an example of an external storage medium that stores the resistance value of the resistive heating element or the adjusted power supply output determined in accordance with the resistance value of the resistive heating element. Further, the memory 111M includes the identification information associated with the resistance value of the resistive heating element or the adjusted power supply output as the specifying information as described above.

As illustrated in FIG. 5, the control circuit 50 includes an external access section 52. The external access section 52 has a function of directly or indirectly accessing the server 300. FIG. 5 illustrates the function of the external access section 52 to access the server 300 via the communication terminal 200. In such a case, for example, the external access section 52 may be a module (for example, a USB port) for connection with the communication terminal 200 using a wire, or may be a module for connection with the communication terminal 200 using a radio (for example, a Bluetooth module).

However, the external access section 52 may have a function of directly communicating with the server 300. In such a case, the external access section 52 may be a wireless LAN module.

The external access section 52 reads the identification information from the memory 111M and uses the read identification information to acquire the information (that is, the resistance value of the resistive heating element or the adjusted power supply output) associated with the identification information from the server 300.

The control section 51 controls the power supply output to the resistive heating element based on the information (that is, the resistance value of the resistive heating element or the adjusted power supply output) that is acquired using the identification information from the server 300 by the external access section 52. A method of controlling the power supply output to the resistive heating element is the same as that in the first embodiment.

(Action and Effect)

In Modified Example 1, the identification information associated with the resistance value of the resistive heating element or the adjusted power supply output is used as the specifying information configured to specify the power supply output to the atomization section 111R (resistive heating element). Therefore, it is possible to optimize the control of the power supply output to the resistive heating element without concerning about the restriction on the use of thermography, as with the first embodiment.

Modified Example 2

Hereinafter, Modified Example 2 of the first embodiment will be described. Differences from Modified Example 1 will be described hereinafter.

Specifically, the information source which includes the specifying information configured to specify the power supply output to the resistive heating element is the memory 111M provided in the atomizing unit 111 in Modified Example 1. In contrast, an information source is a medium or the like that is provided separately from the atomizing unit 111 in Modified Example 2. The atomizing unit 111 and the medium forms an atomizing unit package. Incidentally, the medium includes the identification information associated with the resistance value of the resistive heating element or the adjusted power supply output as the specifying information, as with Modified Example 1. The medium is, for example, a paper medium (a label affixed to an outer surface of the atomizing unit 111, a description enclosed with the atomizing unit 111, a container such as a box that houses the atomizing unit 111, or the like) on which the identification information is expressed.

Figure 6:
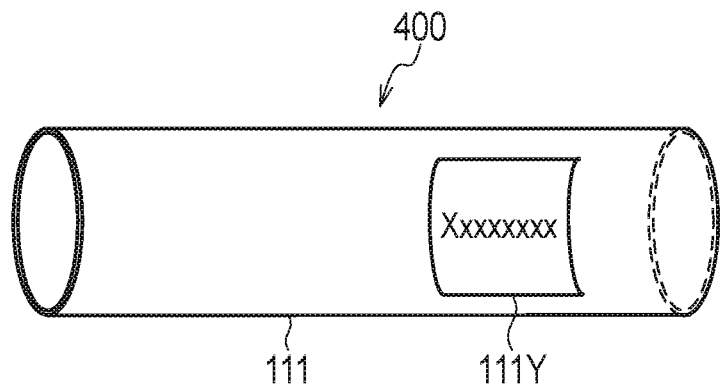
FIG. 6 is a diagram illustrating an atomizing unit package 400 according to Modified Example 2.

In Modified Example 2, an atomizing unit package 400 includes the atomizing unit 111 and a label 111Y affixed to the outer surface of the atomizing unit 111 as illustrated in FIG. 6. The label 111Y is an example of the information source which includes the identification information associated with the resistance value of the resistive heating element or the adjusted power supply output as the specifying information.

(Block Configuration)

Figure 7:
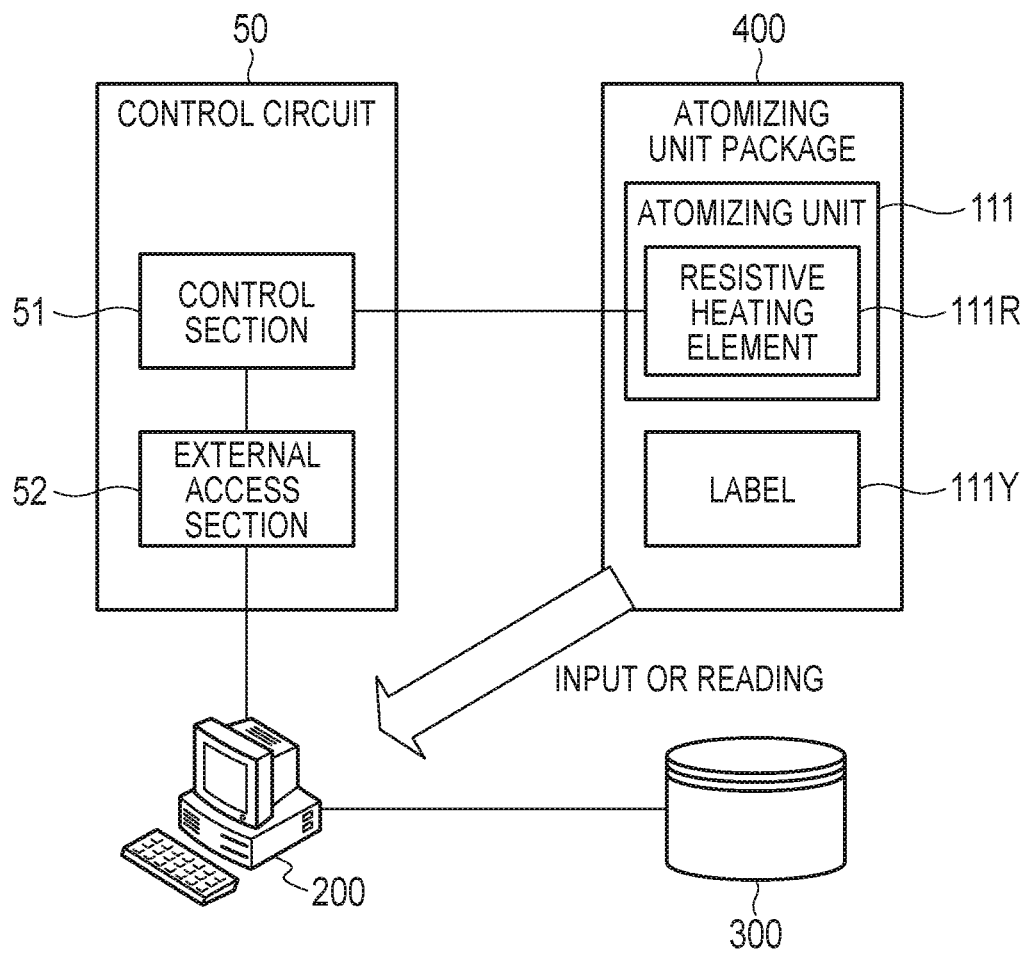
FIG. 7 is a diagram illustrating a block configuration of the non-combustion type flavor inhaler 100 according to Modified Example 2.

Hereinafter, a block configuration of a non-combustion type flavor inhaler according to Modified Example 2 will be described. FIG. 7 is a diagram illustrating the block configuration of the non-combustion type flavor inhaler 100 according to Modified Example 2. It should be noted that the same configurations as those in FIG. 5 are denoted by the same reference signs in FIG. 7.

As illustrated in FIG. 7, the communication terminal 200 acquires the identification information included in the label 111Y by inputting the identification information or reading the identification information. The communication terminal 200 acquires the information (that is, the resistance value of the resistive heating element or the adjusted power supply output) associated with the acquired identification information from the server 300.

The external access section 52 acquires the information (that is, the resistance value of the resistive heating element or the adjusted power supply output) acquired from the server 300 by the communication terminal 200, from the communication terminal 200.

The control section 51 controls the power supply output to the resistive heating element based on the information (that is, the resistance value of the resistive heating element or the adjusted power supply output) that is acquired using the identification information from the server 300 by the external access section 52. A method of controlling the power supply output to the resistive heating element is the same as those in the first embodiment and Modified Example 1.

Incidentally, the case where the communication terminal 200 acquires the identification information from the label 111Y has been described in Modified Example 2. However, the embodiment is not limited to this case. When the control circuit 50 has the function of inputting the identification information or reading the identification information, the control circuit 50 may acquire the identification information from the label 111Y.

(Action and Effect)

In Modified Example 2, the medium that is provided separately from the atomizing unit 111 is used as the information source which includes the specifying information configured to specify the power supply output to the resistive heating element. Therefore, even if the memory 111M is not mounted on the atomizing unit 111, it is possible to optimize the control of the power supply output to the resistive heating element without concerning about the restriction on the use of thermography, as with the first embodiment.

Second Embodiment

Figure 8:
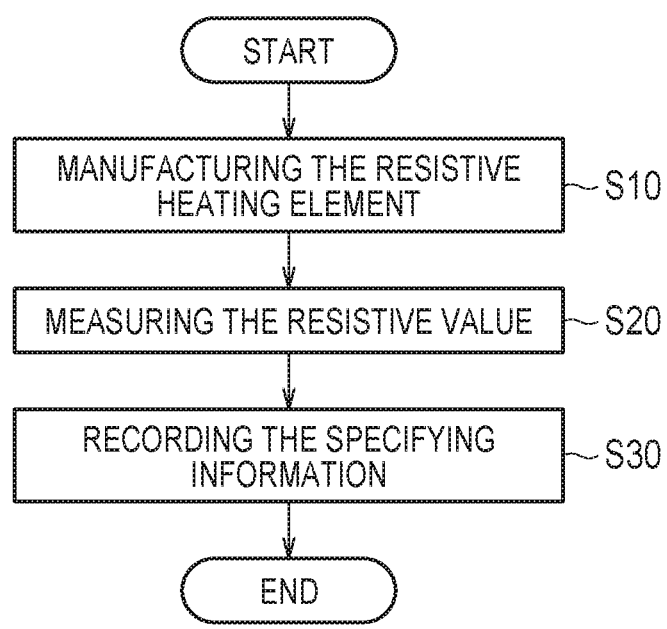
FIG. 8 is a flowchart illustrating a method of manufacturing the atomizing unit 111 according to a second embodiment.

Hereinafter, a second embodiment will be described. In the second embodiment, a method of manufacturing the atomizing unit 111 will be described with reference to FIG. 8. FIG. 8 is a flowchart illustrating the method of manufacturing the atomizing unit 111 according to the second embodiment.

As illustrated in FIG. 8, the resistive heating element (atomization section 111R) which atomizes the aerosol source by resistance heat is manufactured in Step S10.

After Step S10, the resistance value of the resistive heating element is measured in Step S20 (step A). The resistance value of the resistive heating element may be measured after bringing the resistive heating element into contact with the aerosol suction section (for example, the wick 111Q) and connecting the electrode for connection with the power supply to the resistive heating element. Alternatively, the resistance value of the resistive heating element may be measured after assembling the atomizing unit 111 including the resistive heating element. The assembly of the atomizing unit 111 is a step of housing the reservoir 111P, the wick 111Q, the atomization section 111R, and the like inside a housing to assemble the atomizing unit 111. In such a case, the resistance value of the resistive heating element is preferably measured before injecting the aerosol source into the reservoir 111P. Accordingly, it is possible to reuse members other than the resistive heating element when the resistance value does not fall within a permissible range and it is determined that the assembly of the atomizing unit 111 is defective.

Here, the resistance value of the resistive heating element is preferably measured at temperature lower than the use temperature of the resistive heating element, and more preferably measured at normal temperature. It is unnecessary to perform energization to the resistive heating element until the temperature of the resistive heating element reaches the use temperature, and it is possible to simplify the process of manufacturing the atomizing unit 111. In such a case, it is preferable that the temperature coefficient α of the resistance value of the resistive heating element be $0.8 \times 10^{-3} [° C.^{-1}]$ or less (preferably, $0.4 \times 10^{-3} [° C.^{-1}]$ or less). Accordingly, a difference of a resistance value with respect to the resistance value of the resistive heating element at the use temperature is small even when a value measured at the temperature (for example, normal temperature) lower than the use temperature of the resistive heating element is used as the resistance value of resistive heating element without considering the change in the resistance value of the resistive heating element accompanying the temperature change. Therefore, it is possible to appropriately suppress the variation in the temperature of the resistive heating element accompanying the variation in the resistance value of the resistive heating element.

On the other hand, when the temperature coefficient α of the resistance value of the resistive heating element is larger than $0.8 \times 10^{-3} [° C.^{-1}]$, the difference between the resistance value at temperature (for example, normal temperature) lower than the use temperature of the resistive heating element and the resistance value at the use temperature is large, and thus, the resistance value of the resistive heating element is preferably measured at the use temperature. Accordingly, it is possible to appropriately optimize the control of the power supply output to the resistive heating element.

In Step S30, the resistance value measured in Step S20, the adjusted power supply output determined in accordance with the resistance value measured in Step S20, or the identification information associated with the resistance value or the adjusted power supply output is recorded in the information source (step B).

Here, in the atomizing unit 111 illustrated in the first embodiment, Step S30 is a step of recording the resistance value measured in Step S20 or the adjusted power supply output determined in accordance with the resistance value measured in Step S20 in the information source (memory 111M) provided in the atomizing unit 111.

Alternatively, in the atomizing unit 111 illustrated in Modified Example 1, Step S30 is a step of recording the identification information associated with the resistance value of the resistive heating element or the adjusted power supply output in the information source (memory 111M) provided in the atomizing unit 111. In such a case, the method of manufacturing the atomizing unit 111 further includes a step (step C) of storing the resistance value of the resistive heating element or the adjusted power supply output determined in accordance with the resistance value of the resistive heating element in the external storage medium (for example, the server 300) which is accessible to the non-combustion type flavor inhaler 100 (external access section 52).

Alternatively, in the atomizing unit package 400 illustrated in Modified Example 2, Step S30 is a step of recording the identification information associated with the resistance value or the adjusted power supply output in the information source (label 111Y) included in the atomizing unit package 400. In such a case, the method of manufacturing the atomizing unit 111 further includes a step (step C) of storing the resistance value of the resistive heating element or the adjusted power supply output determined in accordance with the resistance value of the resistive heating element in the external storage medium (for example, the server 300) which is accessible to the non-combustion type flavor inhaler 100 (external access section 52).

(Action and Effect)

In the second embodiment, the resistance value of the resistive heating element or the adjusted power supply determined in accordance with the resistance value of the resistive heating element is used as the specifying information configured to specify the power supply output to the resistive heating element (atomization section 111R). That is, thermography is not used, and thus, it is possible to optimize control of the power supply output to the resistive heating element without concerning about the restriction on the use of thermography.

In the second embodiment, the resistance value of the resistive heating element is measured after bringing the resistive heating element into contact with the aerosol suction section (for example, the wick 111Q) and connecting the electrode for connection with the power supply to the resistive heating element. Therefore, the resistance value is measured in the state close to a product configuration at the time of shipment, and thus, it is possible to improve the accuracy of optimization of control of the power supply output to the resistive heating element.

In the second embodiment, the resistance value of the resistive heating element is measured after assembling the atomizing unit 111 including the resistive heating element. Therefore, it is possible to measure the resistance value of the resistive heating element after stocking the assembled atomizing unit 111, and thus, it is possible to simplify the process of manufacturing the atomizing unit 111.

In the second embodiment, the resistance value of the resistive heating element is measured at the temperature lower than the use temperature of the resistive heating element after assembling the atomizing unit 111 including the resistive heating element and before injecting the aerosol source into the reservoir 111P. Accordingly, it is possible to suppress damage to each member (for example, the wick 111Q, or the like) accompanying heating of the resistive heating element.

Other Embodiments

Although the present invention has been described with reference to the above-described embodiments, it should not be understood that the description and the drawings forming a part of this disclosure limit the present invention. Various alternative embodiments, examples and operational techniques will be apparent to those skilled in the art from this disclosure.

The cartridge 130 does not include the atomizing unit 111 in the embodiment, but the embodiment is not limited thereto. For example, the cartridge 130 may form one unit together with the atomizing unit 111.

Although not particularly described in the embodiment, the atomizing unit 111 may be configured to be connectable to the inhaler main body 110.

Although not particularly described in the embodiment, the control section 51 may control the power supply output to the atomization section 111R (resistive heating element) by pulse control. The control section 51 may increase the power supply output (for example, the duty ratio of the voltage applied to the resistive heating element) to the resistive heating element in a one-time puff operation based on a decrease of the amount of power stored in the power supply (for example, a lithium battery) provided in the electrical unit 112 and the resistance value of the resistive heating element such that the amount of aerosol atomized by the atomizing section 111R falls within a desired range. In such a case, the adjusted power supply output may be determined in accordance with the power supply output (for example, the duty ratio of the voltage applied to the resistive heating element), which increases along with the decrease of the amount of power stored in the power supply, and the resistance value of the resistive heating element. The desired range is, for example, a range of 0.1 mg/one-time puff operation or more and 4.0 mg/one-time puff operation or less.

INDUSTRIAL APPLICABILITY

According to the embodiments, it is possible to provide the method of manufacturing the atomizing unit, the non-combustion type flavor inhaler, the atomizing unit and the method of manufacturing the atomizing unit which make it possible to optimize the control of the power supply output to the resistive heating element without concerning about the restriction on the use of thermography without using thermography.

The invention claimed is:

1. A method of manufacturing an atomizing unit for use in a non-combustion type flavor inhaler, comprising the steps of:
    providing a resistive heating element which is configured to atomize an aerosol source held in a reservoir by resistance heat;
    providing an information source;
    measuring a resistance value of the resistive heating element;
    recording in the information source specifying information including:
        i) the resistance value measured in the step of measuring,
        ii) an adjusted power supply output determined in accordance with the resistance value as a power supply output to the resistive heating element, or
        iii) identification information associated with the resistance value or the adjusted power supply output; and
    injecting the aerosol source into the reservoir,
    wherein the step of measuring is performed prior to the step of injecting.

2. The method of manufacturing the atomizing unit according to claim 1, wherein
    the step of measuring further comprises measuring the resistance value after bringing the resistive heating element into contact with an aerosol suction section to suck up the aerosol source and connecting an electrode for connection with a power supply to the resistive heating element.

3. The method of manufacturing the atomizing unit according to claim 1, wherein
    the step of measuring further comprises measuring the resistance value after assembling the atomizing unit including the resistive heating element.

4. The method of manufacturing the atomizing unit according to claim 1, wherein
    the information source is provided in the atomizing unit including the resistive heating element.

5. The method of manufacturing the atomizing unit according to claim 1, further comprising
    storing the resistance value or the adjusted power supply output in an external storage medium which is accessible to a non-combustion type flavor inhaler including the atomizing unit,
    wherein the step of recording further comprises recording the identification information in the information source.

6. The method of manufacturing the atomizing unit according to claim 1, wherein
    the step of measuring further comprises measuring the resistance value at temperature lower than use temperature of a non-combustion type flavor inhaler.

7. The method of manufacturing the atomizing unit according to claim 1, wherein
    the step of measuring further comprises measuring the resistance value at a normal temperature in a range of 5° and 35°.

8. The method of manufacturing the atomizing unit according to claim 6, wherein
    a temperature coefficient α of the resistance value is $0.8 \times 10^{-3} [° C.^{-1}]$ or less.

9. The method of manufacturing the atomizing unit according to claim 6, wherein
    a temperature coefficient α of the resistance value is $0.4 \times 10^{-3} [° C.^{-1}]$ or less.

* * * * *